United States Patent [19]

Hara et al.

[11] 4,040,074

[45] Aug. 2, 1977

[54] SEMICONDUCTOR COLD ELECTRON EMISSION DEVICE

[75] Inventors: Katsuo Hara; Minoru Hagino; Tokuzo Sukegawa, all of Hamamatsu, Japan

[73] Assignee: Hamamatsu Terebi Kabushiki Kaisha, Hamamatsu, Japan

[21] Appl. No.: 724,759

[22] Filed: Sept. 20, 1976

Related U.S. Application Data

[62] Division of Ser. No. 669,237, March 22, 1976, which is a division of Ser. No. 451,754, March 24, 1974, Pat. No. 3,972,060.

[51] Int. Cl.[2] .................... H01L 29/161; H01L 27/14

[52] U.S. Cl. ....................................... 357/16; 357/30; 357/17; 357/52; 357/61

[58] Field of Search ....................... 357/16, 30, 52, 61, 357/17, 18

[56] References Cited

U.S. PATENT DOCUMENTS

| | | | |
|---|---|---|---|
| 3,667,007 | 5/1972 | Kressel | 317/235 R |
| 3,696,262 | 10/1972 | Antypass | 313/94 |
| B 309,756 | 1/1975 | Kressel | 148/171 |

OTHER PUBLICATIONS

Schadi, *Appl. Phys. Litt.* vol. 20, No. 10, May 15, 1972.

*Primary Examiner*—Martin H. Edlow
*Attorney, Agent, or Firm*—Moonray Kojima

[57] ABSTRACT

A semiconductor cold emission device comprising at least two different semiconductors and a junction with a first region having n-type conductivity and a second region which is a p-type conductivity and an indirect transition type material whose effective forbidden band-width is smaller than that of the first region and means for applying voltage to the junction to cause electrons injected from the first region to the second region to be emitted from the surface of the second region to the exterior.

3 Claims, 17 Drawing Figures

SEMICONDUCTOR COLD ELECTRON EMISSION DEVICE

This is a division of Ser. No. 669,237, filed March 22, 1976, which is itself a division of Ser. No. 451,754, filed March 24, 1974, now U.S. Pat. No. 3,972,060 issued July 27, 1976.

BACKGROUND OF THE INVENTION

This invention relates to cold emission semiconductor devices.

There are known cold electron emission semiconductor devices, such as cathodes, comprising p-n junctions with homogeneous forbidden band gaps, such as silicon (Si), gallium arsenide (GaAs) and gallium-arsenic-phosphorus (Ga(AsP). In these prior devices work function is decreased by cleaning the surfaces and activating with cesium or cesium and oxygen. Thus, the prior devices are made so that the electrons passing through the junctions are emitted into vacuum from the surfaces. It has also been previously proposed to use, in such devices, n-(AlGa)As- p-GaAs different type or sometimes known also as heterogeneous junctions wherein the effective forbidden band gap of the n-layer is made greater than that of the p-layer, in order to inject electrons from the n-layer into the p-layer with good efficiency. That is, when constructing the p-n junction in a semiconductor device having a homogeneous forbidden band gap, such as silicon, the injection amount of the holes from the p-type region to the n-type region increases considerably as a result of raising the impurity concentration in the p-type region to lower the work function of the surface. Accordingly, the efficiency of injection of electrons to the p-type region is markedly lowered and the cold emission efficiency is reduced.

With silicon, particularly, since the forbidden band gap is as small as 1.107eV, considerable limitation occurs in the manufacture of electron emission surfaces of zero to negative electron affinity. Consequently, the heterojunctions, such as mentioned above, were proposed in order to inject electrons into the p-type region with good efficiency. In such apparatus, however, there is high probability that the electrons will recombine because the gallium arsenide to which the electrons are injected, is a direct transition type semiconductor. Consequently, before the injected electrons reach the surface, a considerable amount of them will be lost by recombination. In order to decrease this recombination, it has been priorly considered to make the p-type layer thinner than the diffusion length of the electrons. However, since there is need to furnish ohmic contacts so that the electron emission will not be hindered in the p-type layer, if the p-type layer is made thinner, the resistance in the latitudinal direction is increased. Also, since the (AlGa)As layer has poor thermal conduction, the injection density of the electrons cannot be raised, so a point cathode cannot be formed.

Thus, there are numerous disadvantages and deficiencies in prior art devices, which are desirous of reduction or elimination.

SUMMARY OF THE INVENTION

Accordingly, an object of the invention is to eliminate and/or reduce the foregoing and other deficiencies and disadvantages of the prior art.

Briefly, the invention encompasses cold electron emission semiconductor devices, wherein a heterojunction is formed by two or more different semiconductors comprising a first region of n-type material and a second region of a p-type and indirect transition type material whose effective forbidden band width is smaller than that of the first region, and means for applying a voltage to the junction to cause the electrons injected from the first region to the second region to be emitted from the second region surface to the exterior.

Advantageously, the recombination rate is markedly decreased and the efficiency of electron injection is markedly improved.

A feature of the invention is a first region of n-type conductivity and a second region of an indirect transition type material whose effective forbidden band width is smaller than that of the first region.

Another feature of the invention is that the indirect transition type semiconductor is epitaxially grown on the n-type semiconductor defining the first region.

Suitable materials for the device are materials, such as AlP, ZnS, ZnSe, ZnTe, AlAs, AlSb, GaAs, GaP, Al(x-)Ga(1-x)P, Alx Ga(1-x)As, Ga(x)Al(1-x)Sb, InAs, wherein $x$ is a positive number smaller than 1.

A further feature of the invention is the varying of the impurity concentration in the second region or the application of suitable magnetic or electric field to control the electron travel or drift from the junction to the surface. Another feature is the provision of another region which has high thermal conductivity, adjacent the first region, which prevents hole diffusion from the second region to the added other region. A still further feature of the invention is the provision of insulation or high resistance layer at selected areas on one or both sides of the junction to enable control of the electron within certain areas of the junction and to enable control of the electrons from the ohmic contacts.

The foregoing and other features, objects and advantages of the invention will become more evident from the following drawing and detailed description, both of which are to be construed to be illustrative and not limiting in any sense.

DETAILED DESCRIPTION OF PREFERRED EMBODIMENTS

The present invention has eliminated or reduced the various defects of the prior art devices as described above. In the inventive device, there is formed a heterojunction using two or more semiconductor crystals. For example, when a heterojunction is formed with, for example, AlP, GaP and Al(x)Ga(1-x)P, wherein *x* is a positive number less than 1, and which is a mixed cyrstal of AlP and GaP; even when the impurity concentration of the p-type region is high, electrons can be injected therein with good efficiency. Moreover, loss resulting from recombination of the injected electrons is markedly decreased because the p-type region is an indirect transition type semiconductor. Also, the diffusion length of the electrons increases. As this happens, the thickness of the p-type region increases, and the resistance in the latitudinal direction can be decreased. Further, there is simultaneous decrease in the series resistance and the power dissipation also declines. Since the injection density can be raised in the case that the cathode is made of GaP and AlP, which are particularly high in thermal conductivity among semiconductors of III–V compounds. That is, since the thermal conductivity of GaP is 1.1 W/cm ° K and that of AlP is 0.9 W/cm ° K, being considerably larger than those of the priorly used GaAs at 0.54 W/cm ° K and AlAs at 0.08 W/cm °K; and since GaP, AlP, and Al(x)Ga(1-x)P have effective forbidden band gaps of 2 eV or more and their electron affinities are small, when their surfaces are activated with cesium or cesium and oxygen, it is easy to obtain surfaces having zero or negative electron affinities, and the electron pull-out or emission probability becomes very high.

Figure 1:
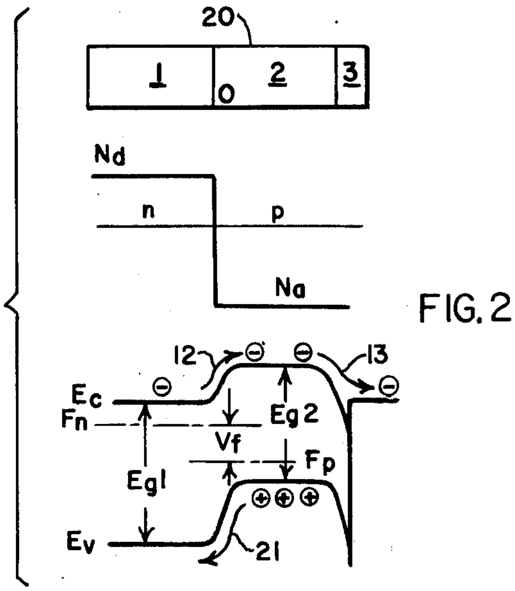
FIG. 1 depicts an illustrative embodiment of the invention showing an energy diagram, impurity concentration chart and model of the device.

Turning now the drawing, in FIG. 1, n-p junction 0 is formed in crystal 20 by first region 1 which is an n-type material of a large effective forbidden band gap and second region 2 which is a p-type material of a smaller effective forbidden gap and of an indirect transition type semiconductor. Surface 3 has a negative electron affinity and is made by cleaning the surface of second region 2 and activating it with cesium or cesium and oxygen. That is L*g*1 and E*g*2 are the effective forbidden band gaps of the two regions, and N*d* and N*a*, respectively, show the donor and acceptor concentration distribution. The energy diagram and impurity concentration chart are well known to workers in the art and need not be described herein. Any good semiconductor handbook or text book will contain an explanation of such diagram and chart. In the diagram, the E*c* is the energy of the bottom of the conduction band, E*v* is the energy of the top of the valence electron band, F*n* and F*p* are, respectively, the quasi Fermi levels for the electrons and the holes, and V*f* is the forward applied voltage.

When crystal 20, formed with such heterojunction is inserted in a vacuum vessel, and a forward voltage V*F* is applied, electrons are injected from the first region 1 to the second region 2 as shown by arrow 12. Since the second region is an indirect transition type semiconductor, the loss of injected electrons by recombination can be substantially ignored. Consequently, their greater portion will arrive at surface 3 by diffusion or drift, and are emitted into the vacuum as shown by arrow 13. Further, since the effective forbidden band gap E*g*1 of the first region 1 is larger than E*g*2 of the second region 2, an energy barrier of the difference is formed against the holes, and the injection of the holes to the first region becomes small enough to be substantially disregarded. Because of this, the injection efficiency of electrons to the second region becomes nearly 100%. The efficiency of cold electron emission eta is given by the product of this injection efficiency alpha, the factor beta at which the injected electrons reach surface 3 and the factor gamma at which the electrons are emitted into vacuum. Since the cathode of the present invention makes all of these latter factors sufficiently large as described above, a very high electron emission efficiency eta is obtained.

Further, FIG. 1 is a case where the second region impurity concentration Na and the forbidden band gap E*g*2 are constant, and the injected electrons arrive at surface 3 mainly by diffusion. Consequently, in order that the transport factor beta is increased, the thickness of the second region 2 must be less than the diffusion length of the electron.

Figure 2:
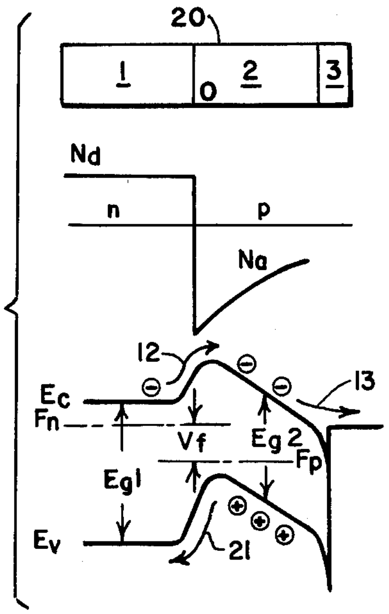
FIG. 2, depicts an embodiment similar to FIG. 1 except for the varied impurity concentration of the p-type material.

It is possible to raise the rate beta further by utilizing a drift electric field. FIG. 2 describes such an embodiment, wherein the acceptor concentration N*a* in the second region 2 is made to gradually decrease from junction 0 toward surface 3 as depicted. Consequently, there is a slope in the conduction band of the second region 2 because of the impurity concentration slope, and the transport factor beta of the electrons is markedly increased by this drift electric field. However, since the impurity concentration of surface 3 declines, there may be difficulties in making its electron affinity zero or negative.

Figure 3:
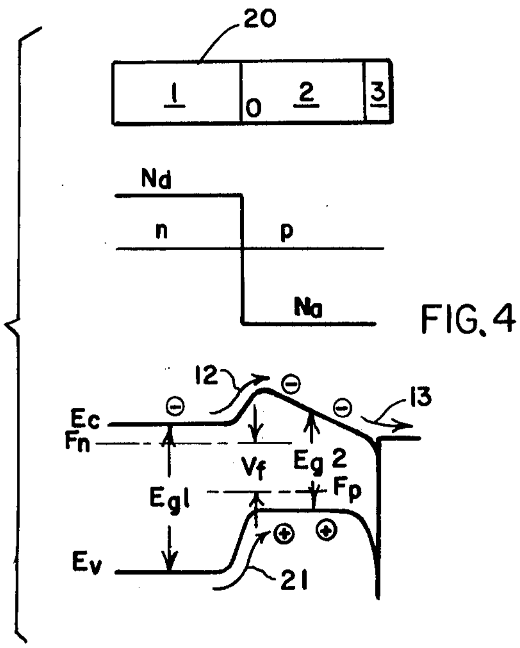
FIG. 3, depicts an embodiment similar to FIG. 1, except for graded fobidden band gap in the p-type material.

FIG. 3 depicts an embodiment wherein this point of difficulty is eliminated. In this embodiment, the effective forbidden band gap of the second region 2 is made to narrow from the junction 0 toward surface 3 as depicted. Consequently, there is a slope in the conduction band gap of the second region 2 and electron transport is done by the drift electric field. Further, in order to obtain the drift electric field as described, it is possible to make combined use of the impurity concentration variation of FIG. 2 and the narrowing of band width as done in FIG. 3, or to transport the electrons at good factors by applying, for example, an electric field or a magnetic field from an external source. Also, when the electrons are transported by diffusion alone as in FIG. 1, their response speed is limited by their diffusion velocity. Consequently, there is also the side effect of raising the response speed by utilizing a drift electric field as described above to raise the transport speed of the electrons.

The different type junction in the cathode of the present invention requires that defects in the junction interface be as few as possible. Consequently, it is necessary that mismatching of the lattice constants and differences in thermal expansion coefficients in the junction interface be small. Materials may be used such that the heterojunction can be formed in monocrystals by solid solution in any desired proportions. It is also important that the electron affinity of the surface of the second region 2 be made zero or negative by suitable activation treatment. Also, the indirect transition type semiconductor should be of a material which will construct a heterojunction. Moreover, the thermal conductivity should be high. Materials suitable for satisfying these conditions are, for example, AlP, GaP and Al(x)Ga(1-x)P. First, in regard to the lattice constants, AlP is 5.4625 Angstroms and GaP is 5.4495 Angstroms, so their lattice mismatch is extremely small. This mismatch is still smaller in heterojunctions with use of their mixed crystals Al(x)Ga(1-x)P. It is also easy to obtain mixed crystals of any desired composition and to obtain zero or negative electron affinities by activation treatment. It is also possible to completely remove the slight disagreements in lattice constants by substituting other Group III atoms for a portion of the lattice sites on the Group III side in at least one of the Gap and AlP, or by substituting other Group V atoms for a portion of the lattice sites on the Group V side, or by adding suitable amounts of impurities. For example, the lattice constant can be increased by substituting in atoms of larger covalent radii for a portion of the Ga lattice sites in the GaP. The same effect can also be obtained by substituting, for example, As or Sb for a portion of the P lattice sites, or by adding impurities of large covalent ion radii such as Cd and Te.

It is further possible to work the present invention with materials other than AlP, Gap or their mixed crystals. For example, it is possible to use heterojunction of compounds of Groups II–VI of the periodic table, such as AlAs and mixed crystals of AlAs and GaAs, AlSb and mixed crystals of AlSb and GaSb, ZnS and GaP and their mixed crystals, and systems including II–VI compounds, for example, ZnSe-GaAs-AlAs system mixed crystals. It is also possible to obtain the drift electric field described above by making crystals comprising solid solutions of two or more of the above semiconductors, and varying the compositions of their several parts so that the widths of the forbidden bands may correspond to what is required. For example, in case where Al(x)Ga(1-x)P is used, the width of the forbidden band may be varied from 2.26 eV of GaP to 2.45 eV of AlP by varying the proportions of Al and Ga as required.

Next will be described the method of manufacturing the cathode of the present invention. First, in regard to the manufacture of the heterojunction, there is first prepared an n-type Gap substrate having a suitable orientation, such as (111), (100) or (110) and having an impurity concentration of $10^{16}$ to $10^{19}$ atom/cm$^3$; one of its surfaces polished to mirror like finish, and the damaged layer chemically removed. On this substrate is grown epitaxially a layer of n-type Al(x)Ga(1-x)P of the desired thickness by a vapor phase or liquid phase growing method to form the first region 1. In this case, the impurity concentration is put at a suitable value between $10^{16}$ and $10^{19}$ atom/cm$^3$ in consideration of the injection efficiency of the electrons.

Then there is grown on this n-type layer to a thickness less than the diffusion length of the electrons, a layer of p-type GaP or Al(y)Ga(1-y)P, where $y$ is less than $x$, where the effective forbidden band gap is less than that of the n-type layer and the impurity concentration is $10^{17}$ to $10^{19}$ atom/cm$^3$ to form a second region 2.

Figure 4:
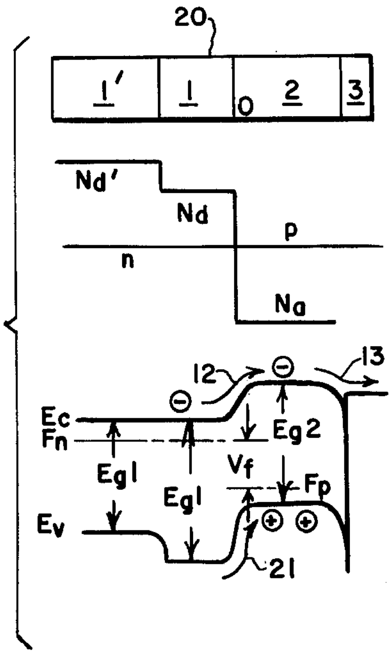
FIG. 4 depicts an embodiment similar to FIG. 1, except for addition of another layer adjacent to the first region.

FIG. 4 shows a heterojunction obtained in the foregoing manner, where region 1' is an n-type GaP base with there being formed thereon, epitaxially grown n-type Al(x)Ga(1-x)P first region 1 and p type GaP or Al(y)-Ga(1-y)P second region 2. Also, in FIG. 4, N*d'* and E*g'* are respectively, the donor concentration and forbidden band gap of the base 1'. In order to prevent holes from being injected into region 1', as shown by arrow 21, it is important that the first region 1 be given a suitable thickness, such as of several hundred Angstroms or more. This will prevent the holes from breaking through, such as by tunneling, from the second region 2 to region 1'. Using a GaP substrate having a high thermal conductivity, and making the substrate 1' and the first region 1 thin are also advantageous from the stand point of heat conduction.

The slide method of manufacture may be used. First, a solution in the proportions of Ga 5.0 g, Te 0.2 mg, GaP 90 mg and Al 2.4 mg is placed in contact with the (111)B surface of the GaP substrate in which $10^{17}$ atom/cm$^3$ Te has been doped, in a hydrogen atmosphere at a temperature of 950° C. Then, the n-type first region 1 ( of for example FIG. 1) is formed by lowering the temperature under these conditions to 930° C and growing Al(x)Ga(1-x)P wherein $x$ is about 0.3 and the impurity concentration is $3 \times 10^{17}$ atom/cm$^3$, to a thickness of about 10 microns. After this treatment, the beat is slid to contact its surface with a solution in the proportions of Ga 5.0g, GaP 84 mg, and Zn 5 mg, in a hydrogen atmosphere. The temperature is lowered to 920° C. The boat is slid again and the alloy is isolated. By means of this treatment, there is formed a p-type second region 2 having an impurity concentration of $10^{18}$ atom/cm$^3$ and a thickness of about 5 microns.

Further, it is possible to obtain an impurity concentration distribution, such as shown in FIG. 2, to this second region 2 by adding suitable amounts of each of the n-type impurity Te and the p-type impurity Zn during the growing of the second region 2. In this case, during growth of the Al(x)Ga(1-x)P layer, the n-type impurity Te becomes predominant, and the Zn impurity of the GaP layer grown next is put at about $10^{17}$ atom/cm$^3$ which is less. Then the crystal grown in this manner is held for 30 minutes to 5 hours in phosphorus vapor of about one atmosphere and given heat treatment at 800° to 900° C for the solid phase diffusion of the Zn of the Al(x)Ga(1-x)P layer into the GaP layer. Since the diffusion coefficient of the Te is less than that of the Zn, the diffusion of the Te may be disregarded.

After an n-type Al(x)Ga(1-x)P layer is grown by the above slide method and when a p-type Al(y)Ga(1-y)P, where $y$ is less than $x$, layer is grown using a small amount of Ga- GaP-Al-Zn solution, the composition of the AlP in the beginning of the growth phase is large, since the segregation coefficient of the Al is large. However, since the amount of the solution is small this component gradually decreases as the growth progresses to vary the width of the forbidden band as shown in FIG. 3.

Next, the crystal obtained as described above is shaped into the desired configuration. The n-type GaP of the substrate side and the p-type GaP of the electron emission surface side or the surface of the Al(y)Ga(1-y)P layer are mechanically polished to a mirror finish, and damaged layer is removed by etching. Metals are desposited in suitable forms as in region 1' and second region 2, as shwon in FIG. 4, onto this crystal substrate, and heat treatment is applied to form ohmic contact electrodes 5 and 6, as shown also in FIGS. 5, 6, 7 and 8 and all the subfigures therein.

Figure 5:
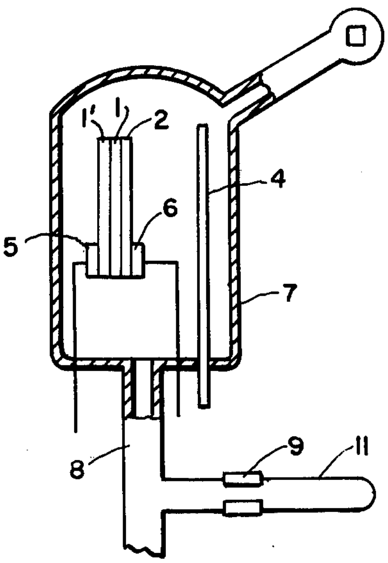
FIG. 5 depicts a vessel for the activation of the emission surface of the device.

The crystal obtained as above is mounted in a vacuum vessel 7, as shown in FIG. 5, and the electrodes 5 and 6 and anode 7 are connected to lead in wires. Vessel 7 is furnished with a branch tube which encloses cesium source 10 with a mixture of cesium chromate and silicon powder, inserted in a nickel capsule; and silver tube 11 which is connected with tube 8 via cover seal 9. The vessel 7 is capable of reaching a pressure on the order of $10^{-9}$ Torr; and may be evacuated in connection with an oil free very high vacuum system, and adsorbed gas on such as vessel wals may be discharged by heating. When a sufficiently high vacuum has been reached, cesium source 10 is heated and cesium generated. The branch tube is cooled, as required, with dry ice or liquid nitrogen, and the cesium condensed in the branch tube. The electron emission surface is cleaned by heating the crystal for a number of minutes at 500° to 700° C under these conditions, or by applying ion bombardment and removing some atomic layers of the surface. After this cleaning treatment has been completed, the electron emission surface is illuminated with white light. Voltage of a number of tens of volts is applied between electrode 6 and anode 4, and the branch tube is gradually heated so that the cesium feeds into vessel 7. A photoelectric current is observed after this activation treatment, the maximum potoelectric current being obtained when the cesium which is on the order of monoatomic layer, has absorped to the electron emission surface. Consequently, when it is found by observation that this photoelectric current has reached maximum value, the branch tube is again cooled and the feeding of the cesium is stopped.

It is also possible to apply voltage between electrodes 5 and 6 and measure the cold electron emission without illumination. After the cesium has been supplied in this manner, silver tube 11 is heated and oxygen in air is supplied to vessel 7. During this feed, the photoelectric sensitivity or cold electron emission is monitored to ensure that the oxygen pressure inside of the vessel does not exceed $10^{-7}$ Torr. Because of the fed in oxygen, the sensitivity will fail temporarily to about one-tenth, but when the cesium is introduced again, it will rise again. When such operations are repeated and the maximum electron current has been obtained, the activation is terminated. It is also possible to use a cesium ion gun as a cesium source. When this method is relied on, it is also possible to perform quantification treatment. After the above activation treatment has been completed, the branch tube and gas exhaust tube 8 are sealed off.

In the device of the present invention, since the electrons that reach electrode 6 among those injected into the second region are lost by recombination or otherwise, and are not emitted into the exterior, it is necessary to give special consideration to the arrangement and installation of the electrodes. That is, it is important, for some purposes, to separate electrodes 6 from junction 0 by more than the diffusion length of the electrons. In conjunction with this, it is also advantageous to form a barrier to the injected electrons and to apply an inverse electric field. To do this, a slope of the impurity concentration and/or the width of the effective forbidden band can be given.

Figure 6A:
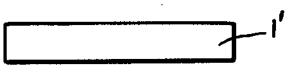
FIGS. 6A, 6B, 6C, 6D, 7A, 7B, 7C, 7D and 8A, 8B, 8C, 8D depict three illustrative embodiments of the invention wherein alternative physical arrangements of the layers are shown.
Figure 6B:
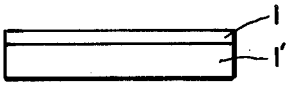
Figure 6C:
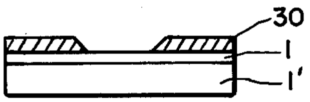
Figure 6D:
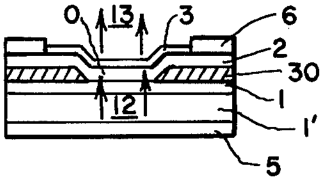

FIGS. 6A, 6B, 6C and 6D depict an embodiment of the invention wherein first an n-type Al(x)Ga(1-x)P first region 1, as shown by FIG. 6B, is formed on n-type GaP base 1', as shown by FIG. 6A. Then insulation film 30 made for example of $Sio_2$ or $Al_2o_3$ is formed to cover selected portions thereof, as shown by FIG. 6C. Second region 2 of p-type GaP is formed or deposited thereon and define therewith junction 0. Consequently, the area of electron injection is restricted to the portion shown by arrows 12 not covered by insulation layer 30. By making the distance between electrode 6 and junction 0 sufficiently large, the injected electrons can be emitted with good efficiency. For layer 30, it is also possible to grow crystals of high resistance, such as Gap or Al(x-)GA(1-x)P instead of the insulation material. On the opposite side of region 1' is disposed electrode 5. Second region 2 has an emission surface 3. In this FIG. 6 and the remaining FIGS. 7 and 8, the same numeral designations are used for similar elements. The same compounds or mixed crystals may be used for similar layers.

Figure 7A:
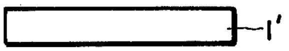
Figure 7B:
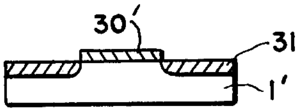
Figure 7C:
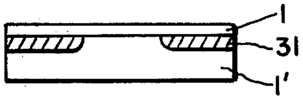
Figure 7D:
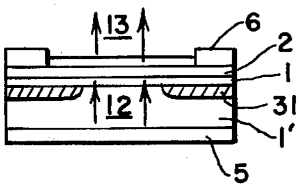

FIGS. 7A, 7B, 7C and 7D depict another embodiment, wherein an oxide film 30', such as $Si0_2$, as shown by FIG. 7B, is first formed on n-type GaP base 1', as shown by FIG. 7A, and then serves as a mask during diffusion process. That is, film 30' is removed after diffusing a p-type impurity, such as Zn, to form p-type region 31, as shown by FIG. 7B. First region 1, as shown in FIG. 7C is formed by growing an n-type Al(x)Ga(1-x)P layer on the region 1' and film 31. Second region 2 of p-type GaP, is furnished on top of this as shown in FIG. 7D to define a junction and an emissive surface 3 from which electrons 13 may be emitted. In this case, the depletion layer made on the boundaries between region 31 and first region 1 and region 1'works as an insulating layer, and together with restricting the electron injection zone not covered by insulating layer 31 effectively increases the distance between the active zone and the electrode 6.

Figure 8A:
Figure 8B:
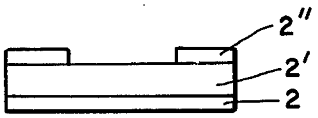
Figure 8C:
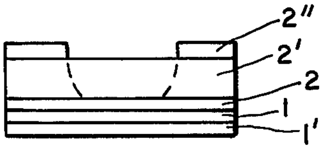
Figure 8D:
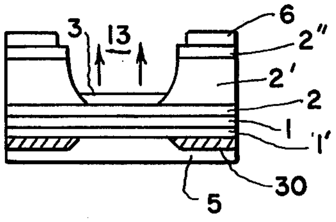

FIGS. 8A, 8B, 8C, and 8D depict another embodiment wherein a mixed crystal base 2' of p-type Al(z-)Ga(1-Z)P, wherein *z* is a positive number less than 1, is first prepared, as shown by FIG. 8A. Then p-type GaP layers 2" are grown at suitable positions on one side of its surfaces as shown in FIG. 8B. Second region 2 is formed on the other surface by growing a p-type GaP layer. Then, as shown in FIG. 8C, an n-type Al(x-)GA81-x)P layer is grown on region 2 to make first region 1, and then n-type GaP layer region 1' is grown. A portion of this crystal as shown by the broken lines, is removed with an etching solution, such as fluoric acid, and insulation film 30 or for example $SiO_2$ is disposed on selected portions of layer 1' for restricting the injection region. Then electrodes 5 and 6 are furnished as shown in FIG. 8D. Also, insulation layer 30 can be replaced with high resistance GaP or other material layer as described above. Since such a cathode can restrict the electron injection range with insulation film 30 together with furnishing region 2' with a wider effective forbidden band gap than the second region 2, the electrons injected into region 2 can be effectively prevented from entering electrode 6. Moreover, since first region 1 and region 1' are formed thinly, it is possible to have little thermal resistance in the direction of electrode 5.

In order to prevent a temperature rise, it is important that the electrode ohmic contact resistance be small. In regard to the several examples described above, since regions 1' and 2' are formed of GaP, this resistance value can be made sufficiently small. However, it is also possible to furnish direct electrodes at the first region and the second region without furnishing the other regions. Also, in order to improve heat diffusion, it is possible to attach the cathode to a base of, for example, diamond or oxygen free copper of good thermal conduction, that is, a heat sink.

As explained above, the cold cathode of this invention prevents recombination of the electrons injected into the second region and is capable of performing electron emission with good efficiency. It is also capable of giving good heat conduction, while at the same time easily forming a point electron source by restricting the electron emitting region. In addition to this, in such case as when attempting to focus the electron current at one point with an electron lense, because of a narrow spread in the initial velocity of the emitted electrons of the semiconductor cold cathode, and a very good point of focus can be obtained. There are also other very superior effects and advantages, such as, that is possible to have high density electron emission with direct current operation, without relying on pulse operation.

The foregoing description is for purposes of illustrating the principles of this invention. Numerous variations and modifications thereof would be apparent to the worker skilled in the art. All such variations and modifications are to be construed to be within the spirit and scope of this invention.

What is claimed is:

1. A cold emission semiconductor device comprising a first layer of GaAlP, and of several hundred Angstroms thickness and of n-type conductivity; a second layer of GaAlP of p-type conductivity and of a thickness less than the diffusion length of electrons, and whose effective forbidden band gap is smaller than that of said first layer, said first and said second layers being intimately in contact with each other through epitaxial growth and which substantial lattice match to form a heterojunction, said second layer having a surface opposite said heterojunction with zero or negative electron affinity for emission of electrons, a first electrode connectable to said first layer, and a second electrode connectable to said second layer with the distance between said second electrode and said heterojunction being more than the diffusion length of electrons, and means for applying a potential to said electrodes to bias said heterojunction and cause said first layer to generate electrons which are subsequently injected into said second layer and without substantially any recombination emitted from said surface of said second layer;

wherein further comprising a third layer disposed adjacent said first layer, said third layer being GaP and of n-type conductivity.

2. The device of claim 1, wherein said surface opposite said heterojunction is activated by cesium or cesium and oxygen.

3. The device of claim 1, further comprising means for providing drift electric field to increase transport factor.

* * * * *